(12) United States Patent
Lee et al.

(10) Patent No.: US 11,171,415 B2
(45) Date of Patent: Nov. 9, 2021

(54) METHOD AND APPARATUS FOR MEASURING PHASE OF TRANSMISSION LINE CONNECTING BETWEEN RF CHIPS

(71) Applicant: Samsung Electronics Co., Ltd., Gyeonggi-do (KR)

(72) Inventors: Jeongho Lee, Gyeonggi-do (KR); Dae Young Lee, Gyeonggi-do (KR); Sunggi Yang, Seoul (KR)

(73) Assignee: Samsung Electronics Co., Ltd

( * ) Notice: Subject to any disclaimer, the term of this patent is extended or adjusted under 35 U.S.C. 154(b) by 287 days.

(21) Appl. No.: 16/177,767

(22) Filed: Nov. 1, 2018

(65) Prior Publication Data

US 2019/0140721 A1    May 9, 2019

(30) Foreign Application Priority Data

Nov. 8, 2017   (KR) ......................... 10-2017-0147853

(51) Int. Cl.
*H01Q 3/00*    (2006.01)
*H01Q 3/26*    (2006.01)
(Continued)

(52) U.S. Cl.
CPC ............. *H01Q 3/267* (2013.01); *H01Q 3/34* (2013.01); *H03K 21/38* (2013.01); *H04B 7/00* (2013.01);
(Continued)

(58) Field of Classification Search
CPC ........ H01Q 3/267; H01Q 3/34; H04B 7/0617; H04B 7/00; H04B 17/14; H03K 21/38; H04L 5/00
(Continued)

(56) References Cited

U.S. PATENT DOCUMENTS 6,717,478 B1   4/2004  Kim et al.
6,865,135 B2 * 3/2005  Choi .................... G11C 7/1066
                                                  327/298
(Continued)

OTHER PUBLICATIONS

Boers, Michael et al., A 16TX/16RX 60 GHz 802.11ad Chipset with Single Coaxial Interface and Polarization Diversity, Copyright 2014 IEEE, IEEE Journal of Solid-State Circuits, vol. 49 No. 12, Dec. 2014, pp. 3031-3045.
(Continued)

*Primary Examiner* — Chuong P Nguyen
(74) *Attorney, Agent, or Firm* — The Farrell Law Firm, P.C.

(57) ABSTRACT

The present disclosure relates to a communication method and system for converging a 5th-Generation (5G) communication system for supporting higher data rates beyond a 4th-Generation (4G) system with a technology for Internet of Things (IoT). An electronic device including a first radio frequency (RF) chip and a second RF chip is provided. The electronic device includes a modem configured to transmit a first clock signal to the second RF chip, the first RF chip connected to the modem and configured to receive a second clock signal from the modem, and the second RF chip electrically connected to the first RF chip through a transmission line and configured to receive the second clock signal from the first RF chip and to measure a phase of the transmission line based on the first clock signal and the second clock signal. The first clock signal and the second clock signal have different frequencies.

18 Claims, 13 Drawing Sheets

(51) Int. Cl.
*H01Q 3/34* (2006.01)
*H04B 7/06* (2006.01)
*H03K 21/38* (2006.01)
*H04B 17/14* (2015.01)
*H04L 5/00* (2006.01)
*H04B 7/00* (2006.01)
*H04L 7/00* (2006.01)

(52) U.S. Cl.
CPC ............ *H04B 7/0617* (2013.01); *H04B 17/14* (2015.01); *H04L 5/00* (2013.01); *H04L 7/00* (2013.01)

(58) Field of Classification Search
USPC ........................................................ 342/372
See application file for complete search history.

(56) References Cited

U.S. PATENT DOCUMENTS

| | | | | |
|---|---|---|---|---|
| 7,493,510 B2* | 2/2009 | Sung | ................. | G06F 1/04 327/156 |
| 7,733,975 B1 | 6/2010 | Tsai et al. | | |
| 8,138,623 B2* | 3/2012 | Rofougaran | ............ | H01L 23/66 307/3 |
| 8,520,400 B2* | 8/2013 | Rofougaran | ............. | H01Q 1/38 361/764 |
| 8,693,601 B2* | 4/2014 | Adut | ................... | H03H 17/0628 375/350 |
| 8,756,557 B2* | 6/2014 | Ng | ........................ | G06F 30/33 716/136 |
| 9,654,118 B2* | 5/2017 | Bae | ........................ | H03L 7/087 |
| 10,050,661 B2* | 8/2018 | Huh | ....................... | H03M 3/466 |
| 10,862,526 B2* | 12/2020 | Huh | ....................... | H03M 3/466 |
| 2013/0137381 A1 | 5/2013 | Vassiliou et al. | | |
| 2013/0170531 A1* | 7/2013 | Adut | ................... | H03H 17/0628 375/226 |
| 2015/0358149 A1 | 12/2015 | Ito | | |
| 2020/0389287 A1* | 12/2020 | Tantos | ................... | H04L 7/0331 |

OTHER PUBLICATIONS

European Search Report dated Feb. 21, 2019 issued in counterpart application No. 18203446.2-1214, 10 pages.

* cited by examiner

METHOD AND APPARATUS FOR MEASURING PHASE OF TRANSMISSION LINE CONNECTING BETWEEN RF CHIPS

CROSS-REFERENCE TO RELATED APPLICATION(S)

This application is based on and claims priority under 35 U.S.C. § 119(a) to Korean Patent Application Serial No. 10-2017-0147853, filed on Nov. 8, 2017, in the Korean Intellectual Property Office, the entire disclosure of which is incorporated herein by reference.

BACKGROUND

1. Field

The present disclosure relates generally to a method and an apparatus, and more particularly, to a method and apparatus for measuring a phase of a transmission line connecting between radio frequency (RF) chips.

2. Description of Related Art

To meet the demand for wireless data traffic having increased since deployment of 4G communication systems, efforts have been made to develop an improved 5G or pre-5G communication system. Therefore, the 5G or pre-5G communication system is also referred to as a 'beyond 4G network' or a 'post long term evolution (LTE) system'. The 5G communication system is considered to be implemented in higher frequency (mmWave) bands (e.g., 60 GHz bands) so as to accomplish higher data rates. To decrease propagation loss of the radio waves and increase the transmission distance, the beamforming, massive multiple-input multiple-output (MIMO), full dimensional MIMO (FD-MIMO), array antenna, an analog beam forming, large scale antenna techniques are discussed in 5G communication systems. In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like. In the 5G system, hybrid FSK and QAM modulation (FQAM) and sliding window superposition coding (SWSC) have been developed as an advanced coding modulation (ACM), and filter bank multi carrier (FBMC), non-orthogonal multiple access (NOMA), and sparse code multiple access (SCMA) have been developed as an advanced access technology.

The Internet is now evolving into the Internet of things (IoT), where distributed entities exchange and process information without human intervention. The Internet of everything (IoE), which is a combination of IoT technology and big data processing technology through connection with a cloud server, has emerged. As technology elements, such as sensing technology, wired/wireless communication and network infrastructure, service interface technology, and security technology have been demanded for IoT implementation, a sensor network, a machine-to-machine (M2M) communication, machine type communication (MTC), and so forth have been recently researched. Such an IoT environment may provide intelligent internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing information technology (IT) and various industrial applications.

Various attempts have been made to apply 5G communication systems to IoT networks. For example, technologies such as a sensor network, MTC, and M2M communication may be implemented by beamforming, MIMO, and array antennas. Application of a cloud RAN as the above-described big data processing technology may also be considered as an example of convergence between 5G technology and IoT technology.

The demand for high-speed data transmission through wireless cellular communication is continuously increasing. When using carrier aggregation technology in the current 4G LTE system, data communication in the unit of Gbps is theoretically supported, and development of such technology makes ubiquitous high-speed communication possible. However, there has recently been an increasing demand for ultrahigh-speed data communication over several tens of Gbps, such as cloud computing and ultrahigh-definition (UHD) video data transmission, and in the next-generation cellular communication, technologies to support such large-capacity ultrahigh-speed data transmission have been developed in many enterprises and educational institutions.

Currently, the band in the range of 5 GHz or less, which is the cellular band, is saturated, and in order to support broadband communication over Gbps, it is necessary to use a mm-Wave band that has not yet been used for the cellular communication. Since the mm-Wave band should be implemented in a different manner from that of the existing legacy cellular communication method due to the high-frequency characteristics thereof, a new method that is different from the existing method is required even from the viewpoint of optimization of the whole system. In particular, a system structure using a plurality of RF chips may be applied to improve mountability.

However, in order to form beams at a precise angle in a system structure using a plurality of RF chips, it is required to accurately know the phase of the beams created through the respective RF chips. If the respective beams have different phases, the beamforming gain value may be lowered, and thus it may not be possible to create the beams at a desired angle.

SUMMARY

The present disclosure has been made to address at least the disadvantages described above and to provide at least the advantages described below.

In accordance with an aspect of the present disclosure, an electronic device including a first RF chip and a second RF chip is provided. The electronic device includes a modem configured to transmit a first clock signal to the second RF chip, the first RF chip connected to the modem and configured to receive a second clock signal from the modem, and the second RF chip electrically connected to the first RF chip through a transmission line and configured to receive the second clock signal from the first RF chip and to measure a phase of the transmission line based on the first clock signal and the second clock signal. The first clock signal and the second clock signal have different frequencies.

In accordance with an aspect of the present disclosure, an electronic device including a first RF chip and a second RF chip is provided. The electronic device includes a modem configured to transmit a first clock signal and a second clock signal to the first RF chip, the first RF chip electrically connected to the second RF chip through a transmission line and configured to transmit the second clock signal to the second RF chip, to receive from the second RF chip a third clock signal fed back corresponding to the second clock signal, and to measure a phase of the transmission line based on the first clock signal and the third clock signal, and the second RF chip formed to radiate beams to an outside of the electronic device. The first clock signal and the second clock signal have different frequencies from each other.

In accordance with an aspect of the present disclosure, a method for measuring a phase of a transmission line connecting a first RF chip and a second RF chip to each other is provided. The method includes receiving, by the second RF chip, a first clock signal from a modem, receiving, by the second RF chip, a second clock signal transmitted from the modem through the first RF chip, inputting, by the second RF chip, the first clock signal and the second clock signal to a phase detector, and measuring, by the second RF chip, a phase of the transmission line based on an output value of the phase detector and a frequency difference between the first clock signal and the second clock signal.

BRIEF DESCRIPTION OF THE DRAWINGS

The above and other aspects, features and advantages of certain embodiments of the disclosure will be more apparent from the following detailed description taken in conjunction with the accompanying drawings, in which.

DETAILED DESCRIPTION

Figure 1:
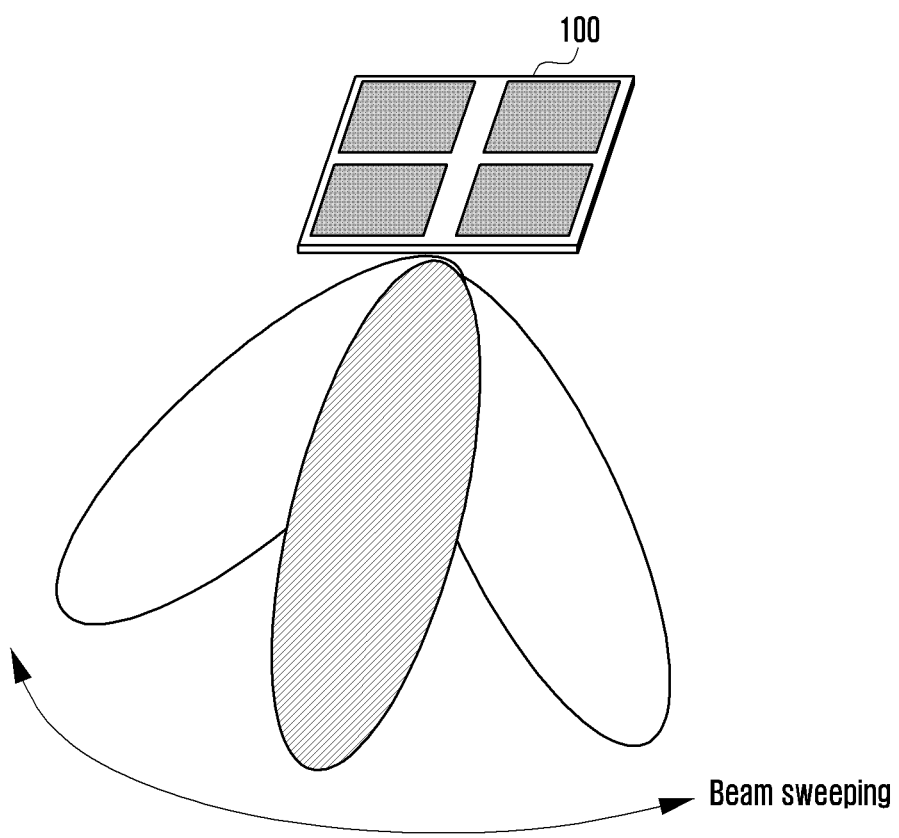
FIG. 1 is a diagram of a beam sweeping through RF chips, according to an embodiment.

Embodiments of the disclosure will be described herein below with reference to the accompanying drawings. However, the embodiments of the disclosure are not limited to the specific embodiments and should be construed as including all modifications, changes, equivalent devices and methods, and/or alternative embodiments of the present disclosure. In the description of the drawings, similar reference numerals are used for similar elements.

The terms "have," "may have," "include," and "may include" as used herein indicate the presence of corresponding features (for example, elements such as numerical values, functions, operations, or parts), and do not preclude the presence of additional features.

The terms "A or B," "at least one of A or/and B," or "one or more of A or/and B" as used herein include all possible combinations of items enumerated with them. For example, "A or B," "at least one of A and B," or "at least one of A or B" means (1) including at least one A, (2) including at least one B, or (3) including both at least one A and at least one B.

The terms such as "first" and "second" as used herein may use corresponding components regardless of importance or an order and are used to distinguish a component from another without limiting the components. These terms may be used for the purpose of distinguishing one element from another element. For example, a first user device and a second user device indicates different user devices regardless of the order or importance. For example, a first element may be referred to as a second element without departing from the scope the disclosure, and similarly, a second element may be referred to as a first element.

It will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

The expression "configured to (or set to)" as used herein may be used interchangeably with "suitable for," "having the capacity to," "designed to," "adapted to," "made to," or "capable of" according to a context. The term "configured to (set to)" does not necessarily mean "specifically designed to" in a hardware level. Instead, the expression "apparatus configured to . . . " may mean that the apparatus is "capable of . . . " along with other devices or parts in a certain context. For example, "a processor configured to (set to) perform A, B, and C" may mean a dedicated processor (e.g., an embedded processor) for performing a corresponding operation, or a generic-purpose processor (e.g., a central processing unit (CPU) or an application processor (AP)) capable of performing a corresponding operation by executing one or more software programs stored in a memory device.

The terms used in describing the various embodiments of the disclosure are for the purpose of describing particular embodiments and are not intended to limit the disclosure. As used herein, the singular forms are intended to include the plural forms as well, unless the context clearly indicates otherwise. All of the terms used herein including technical or scientific terms have the same meanings as those generally understood by an ordinary skilled person in the related art unless they are defined otherwise. Terms defined in a generally used dictionary should be interpreted as having the same or similar meanings as the contextual meanings of the relevant technology and should not be interpreted as having ideal or exaggerated meanings unless they are clearly defined herein. According to circumstances, even the terms defined in this disclosure should not be interpreted as excluding the embodiments of the disclosure.

The term "module" as used herein may, for example, mean a unit including one of hardware, software, and firmware or a combination of two or more of them. The "module" may be interchangeably used with, for example, the term "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the disclosure may include at least one of an application-specific integrated circuit (ASIC) chip, a field-programmable gate array (FPGA), and a programmable-logic device for performing operations which has been known or are to be developed hereinafter.

An electronic device according to the disclosure may include at least one of, for example, a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a MPEG-1 audio layer-3 (MP3) player, a mobile medical device, a camera, and a wearable device. The wearable device may include at least one of an accessory type (e.g., a watch, a ring, a bracelet, an anklet, a necklace, a glasses, a contact lens, or a head-mounted device (HMD)), a fabric or clothing integrated type (e.g., an electronic clothing), a body-mounted type (e.g., a skin pad, or tattoo), and a bio-implantable type (e.g., an implantable circuit).

The electronic device may be a home appliance. The home appliance may include at least one of, for example, a television, a digital video disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

The electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment device, an electronic device for a ship (e.g., a navigation device for a ship, and a gyro-compass), avionics, security devices, an automotive head unit, a robot for home or industry, an automatic teller machine (ATM) in banks, point of sales (POS) devices in a shop, or an IoT device (e.g., a light bulb, various sensors, electric or gas meter, a sprinkler device, a fire alarm, a thermostat, a streetlamp, a toaster, a sporting goods, a hot water tank, a heater, a boiler, etc.).

The electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device may be a combination of one or more of the aforementioned various devices. The electronic device may also be a flexible device. Further, the electronic device is not limited to the aforementioned devices, and may include an electronic device according to the development of new technology.

Hereinafter, an electronic device will be described with reference to the accompanying drawings. In the disclosure, the term "user" indicates a person using an electronic device or a device (e.g., an artificial intelligence electronic device) using an electronic device.

FIG. 1 is a diagram of a beam sweeping through RF chips.

In a communication system using mm-Wave band, unlike the wireless communication method in the related art, a new method should be considered. In particular, in the mm-Wave band, as a frequency becomes higher, a gain loss of beams radiated through RF chips may be heightened. Accordingly, in the mm-Wave band, in order to minimize the gain loss of the beams, a multi-chain structure may be used.

Referring to FIG. 1, one RF chip 100 may have four multi-chains, and may perform beam sweeping by forming the beams through the multi-chains (as used herein, the multi-chain may refer to a plurality of RF chains).

However, there is a physical limit in configuring the multi-chain through one RF chip. More specifically, since an area in which one RF chip can be implemented is limited, as shown in FIG. 1, the number of chains configured in one RF chip 100 is limited.

Unlike the RF chip 100 illustrated in FIG. 1, if needed, up to 32 chains can be implemented in one RF chip, but in the mm-Wave communication system, according to specifications, 256 chains or 1024 or more chains may be required in one electronic device.

Accordingly, in order to solve the above-described problem, a method for configuring a multi-chain using a plurality of RF chips may be considered.

Figure 2:
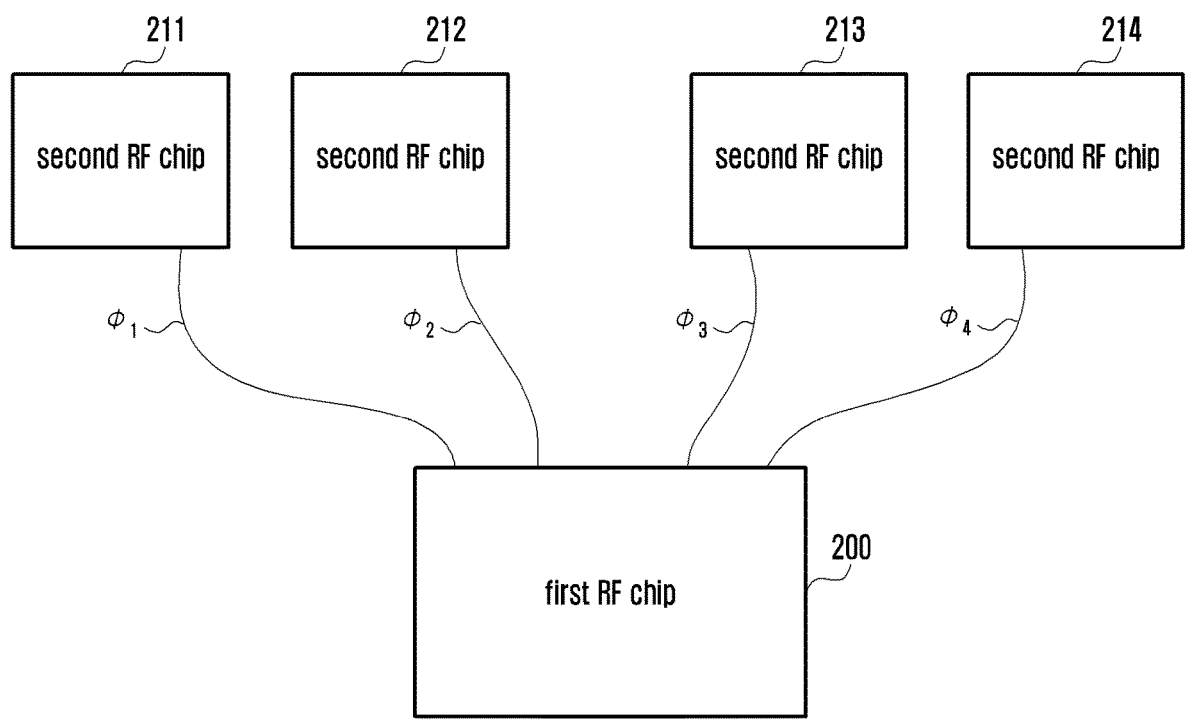
FIG. 2 is a diagram of a structure of an electronic device having a plurality of RF chips, according to an embodiment.

FIG. 2 is a diagram of a structure of an electronic device having a plurality of RF chips.

Referring to FIG. 2, an electronic device includes one first RF chip 200 and four second RF chips 211, 212, 213, and 214. The first RF chip 200 and the plurality of second RF chips 211, 212, 213, and 214 are RF chips capable of performing beamforming in the mm-Wave band.

Since the mm-Wave band uses high frequencies, an RF chip for implementing high frequency, as shown in FIG. 2, may be divided into the first RF chip 200 and the plurality of second RF chips 211, 212, 213, and 214.

Since the plurality of second RF chips 211, 212, 213, and 214 are deployed at ends of the electronic device and radiate beams to the outside of the electronic device, they may be referred to front-end chips. Further, as described above with reference to FIG. 1, the plurality of second RF chips 211, 212, 213, and 214 may have a plurality of RF chains.

As described above with reference to FIG. 1, the number of RF chains using one RF chip is limited. Accordingly, FIG. 2 shows an implementation capable of increasing the number of RF chains through the four second RF chips 211, 212, 213, and 214.

If it is possible to implement up to 16 RF chains in one second RF chip, the number of RF chains implementable in the electronic device shown in FIG. 2 can be 64 (64 RF chains=16 RF chains*4).

As shown in FIG. 2, the first RF chip 200 and the second RF chips 211, 212, 213, and 214 are connected to each other through different transmission lines. The transmission lines connecting between the first RF chip 200 and the second RF chips 211, 212, 213, and 214 may have different phases.

The first RF chip 200 and the second RF chip 211 may be connected to each other through the transmission line having a phase of 5° ($\emptyset_1$), and the first RF chip 200 and the second RF chip 212 may be connected to each other through the transmission line having a phase of 3° ($\emptyset_2$). Further, the first RF chip 200 and the second RF chip 213 may be connected to each other through the transmission line having a phase of 4° ($\emptyset_3$), and the first RF chip 200 and the second RF chip 214 may be connected to each other through the transmission line having a phase of 7° ($\emptyset_4$).

Even if the first RF chip 200 transmits a control command for generating beams having the same phase to the second RF chips 211, 212, 213, and 214, the respective second chips may generate beams having different phases due to the phase difference of the transmission line, and thus the beams may not be radiated at a desired angle or the gain value of the beams may be considerably reduced.

In order to solve the above-described problems, there is a need for a method for accurately measuring the phase of the transmission line connecting between the first RF chip and the second RF chip and compensating for the phase difference between the first RF chip and the second RF chip based on the measured phase.

The transmission line may refer to an RF signal line connecting between the first RF chip and the second RF chip. A physical cable, a PCB, and a waveguide may be included in the transmission line.

Figure 3:
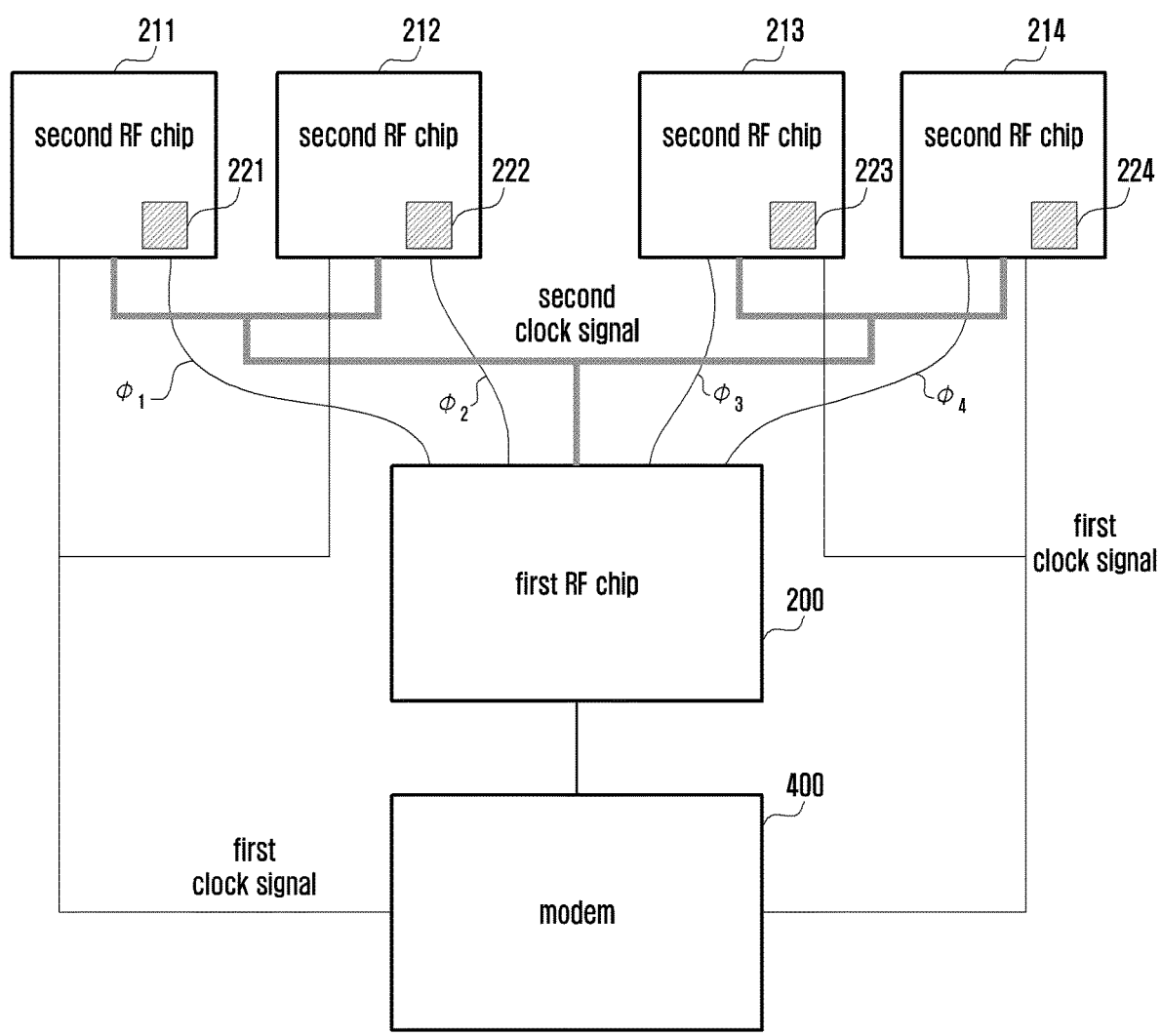
FIG. 3 is a diagram of a structure of an electronic device having a plurality of RF chips, according to an embodiment.

FIG. 3 is a diagram of a structure of an electronic device having a plurality of RF chips, according to an embodiment.

Referring to FIG. 3, one first RF chip 200 may be connected to four second RF chips 211, 212, 213, and 214, and may be connected to a modem 400. The modem 400 may be a digital modem, and may modulate and demodulate signals transmitted and received through the first RF chip 200 and the second RF chip 211.

The modem 400 may transmit a second clock signal to the first RF chip 200, and may transmit a first clock signal to the second RF chip 211. Frequencies of the first clock signal and the second clock signal should be different from each other.

Phase measurement circuits 221, 222, 223, and 224 measuring the phase of the transmission line may be deployed on the second RF chips 211, 212, 213, and 214, respectively. The first RF chip 200 may transmit the second clock signal received from the modem 400 to the second RF chips 211, 212, 213, and 214, respectively.

The phase measurement circuits 221, 222, 223, and 224 deployed on the respective second RF chips may measure phases $\emptyset_1$, $\emptyset_2$, $\emptyset_3$, and $\emptyset_4$ of the transmission lines connecting between the first RF chip 200 and the second RF chips 211, 212, 213, and 214 based on the first clock signal and the second clock signal.

The operations of the first RF chip 200 and the second RF chips 211, 212, 213, and 214 will be described in more detail with reference to FIGS. 4A and 4B. Although FIG. 3 illustrates a case where one first RF chip 200 and four second RF chips 211, 212, 213, and 214 are deployed inside the electronic device, the scope of the present disclosure should not be limited to the number of RF chips as described above.

Figure 4A:
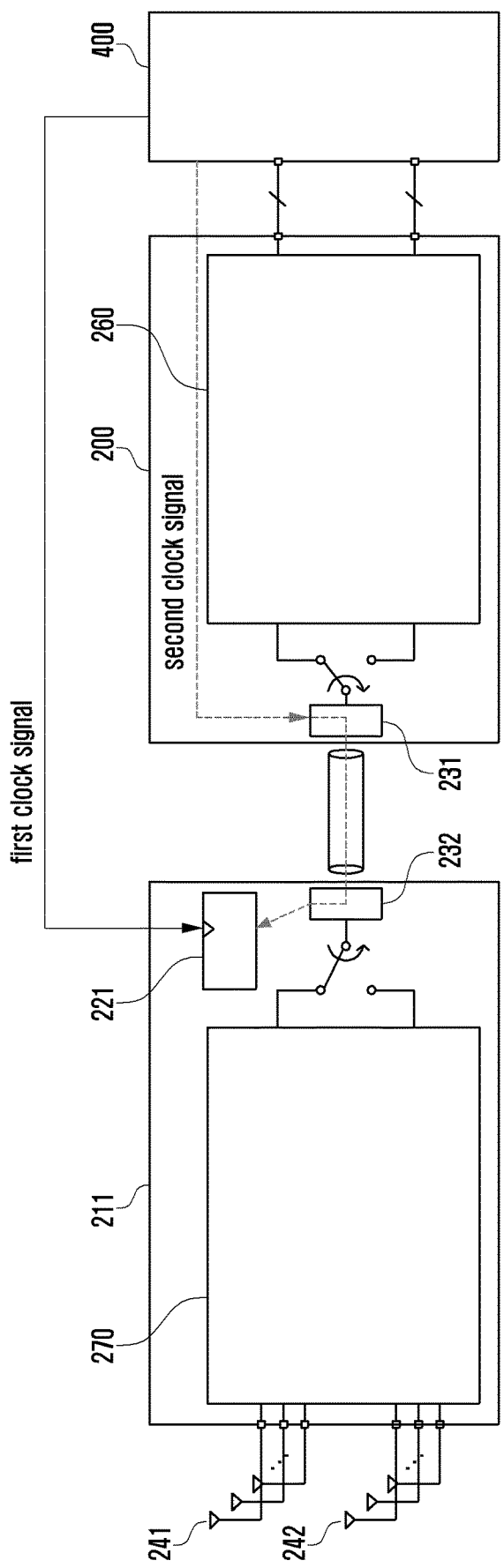
FIG. 4A is a diagram of an internal structure of an RF chip, according to an embodiment.

FIG. 4A is a diagram of an internal structure of an RF chip, according to an embodiment.

Referring to FIG. 4A, a structure in which the first RF chip 200 and the second RF chip 211 are connected to each other is shown. The internal structure between the first RF chip and the second RF chips 212, 213, and 214 may be similar to the internal structure illustrated in FIG. 4A.

The electronic device may include the modem 400 transmitting the first clock signal to the second RF chip 211, the first RF chip 200 connected to the modem 400 to receive the second clock signal from the modem 400, and the second RF chip 211 electrically connected to the first RF chip 200 through the transmission line to receive the second clock signal from the first RF chip 200 and to measure the phase of the transmission line based on the first clock signal and the second clock signal.

The first RF chip 200 may control a signal that is transmitted and received through the first RF chip 200 through a black box 260. Since the detailed configuration of the black box 260 is not related to the technical feature to be described in the present disclosure, and thus may have a different structure depending on a wireless communication processor design type, explanation of the configuration of the black box 260 will be omitted in the description.

The first RF chip 200 having received the second clock signal from the modem 400 may transmit the second clock signal to the second RF chip 211 through the transmission line. The first RF chip 200 and the second RF chip 211 may include frequency selectors 231 and 232, respectively, and a plurality of frequency band signals may be simultaneously transmitted and received through the transmission line. A frequency division transmission method through the frequency selectors 231 and 232 will be described in detail with reference to FIG. 4B.

The second RF chip 211 may receive the second clock signal from the first RF chip 200 through the frequency selector 232, and the second clock signal may be transferred to a measurement circuit 211 deployed inside the second RF chip 211.

A phase measurement circuit 221 may measure the phase of the transmission line based on the first clock signal received through the modem 400 and the second clock signal received through the first RF chip 200. The first clock signal and the second clock signal may have different frequencies. The operation of the phase measurement circuit 221 will be described in more detail with reference to FIGS. 7A, 7B, and 8.

The second RF chip 211 may also include a black box 270 for controlling a signal transmitted and received through the second RF chip 211 in the same manner as the first RF chip 200, and the second RF chip 211 may be connected to a plurality of antenna arrays 241 and 242 so as to radiate beams to an outside of the electronic device.

The second RF chip 211 may further include a temperature sensor.

Generally, in the mm-Wave band, due to high operating frequency, the phase of the transmission line may be changed in accordance with the temperature thereof. Accordingly, the second RF chip may sense or measure a temperature change through the temperature sensor, and if the temperature change amount is greater than or equal to a predetermined temperature threshold value, the second RF chip may measure the phase of the transmission line based on the first clock signal and the second clock signal. The phase measurement circuit 221 may use the temperature as a trigger condition for measuring the phase of the transmission line.

The second RF chip 211 may further include an output sensor, and the second RF chip 211 may sense and measure an output change through the output sensor, and if the output change amount is greater than or equal to a predetermined output threshold value, the second RF chip may measure the phase of the transmission line based on the first clock signal and the second clock signal.

More specifically, if the signal output through the second RF chip is changed, there is a possibility that the change occurs through a loss of the transmission line, and the second RF chip may measure the phase of the transmission line based on the first clock signal and the second clock signal.

Further, the phase measurement circuit 221 may measure the phase of the transmission line at predetermined intervals in addition to measurement of the phase of the transmission line based on the specific trigger condition (temperature or output) as described above.

Figure 4B:
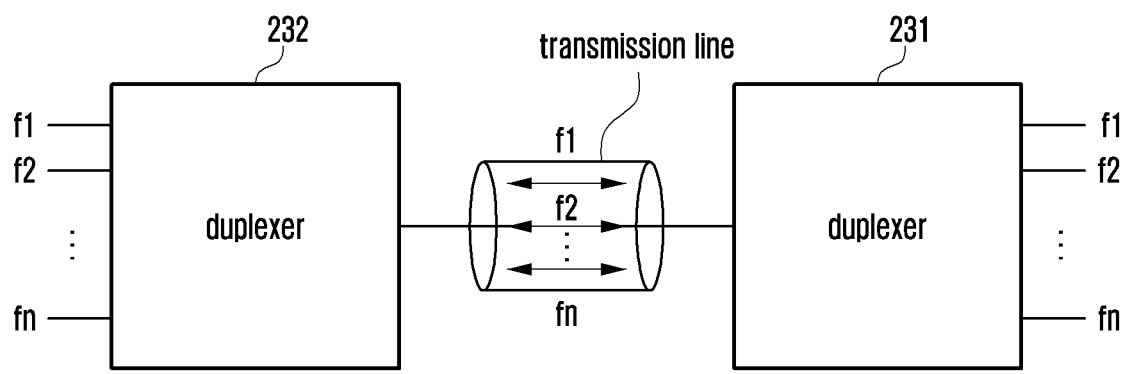
FIG. 4B is a diagram of frequency division transmission, according to an embodiment.

FIG. 4B is a diagram of frequency division transmission, according to an embodiment.

Referring to FIG. 4B, the first RF chip and the second RF chip may include the frequency selectors 231 and 232, respectively. The frequency selectors 231 and 232 may include duplexers or triplexers.

If the frequency selectors 231 and 232 are composed of duplexers, two kinds of frequency band signals may be simultaneously transmitted and received through the transmission line (if the frequency selectors are composed of triplexers, three kinds of frequency band signals may be simultaneously transmitted and received). A frequency division multiple access (FDMA) communication method may be used through the frequency selectors.

Since the frequency selectors 231 and 232 are respectively deployed on the first RF chip and the second RF chip, the electronic device may radiate beams to outside through the first RF chip and the second RF chip, and may measure the phase of the transmission line at the same time.

A signal for forming the beams may be transmitted and received through the transmission line, and a signal for measuring the phase of the transmission line may be transmitted and received through the transmission line at the same time. Accordingly, the phase difference caused by the transmission line may be compensated for through real-time measurement of the phase of the transmission line simultaneously with the beam radiation.

Although only the duplexers and triplexers have been described, as shown in FIG. 4B, n kinds of frequency band signals may be simultaneously transmitted and received through the transmission line by the frequency selectors 231 and 232.

Figure 5:
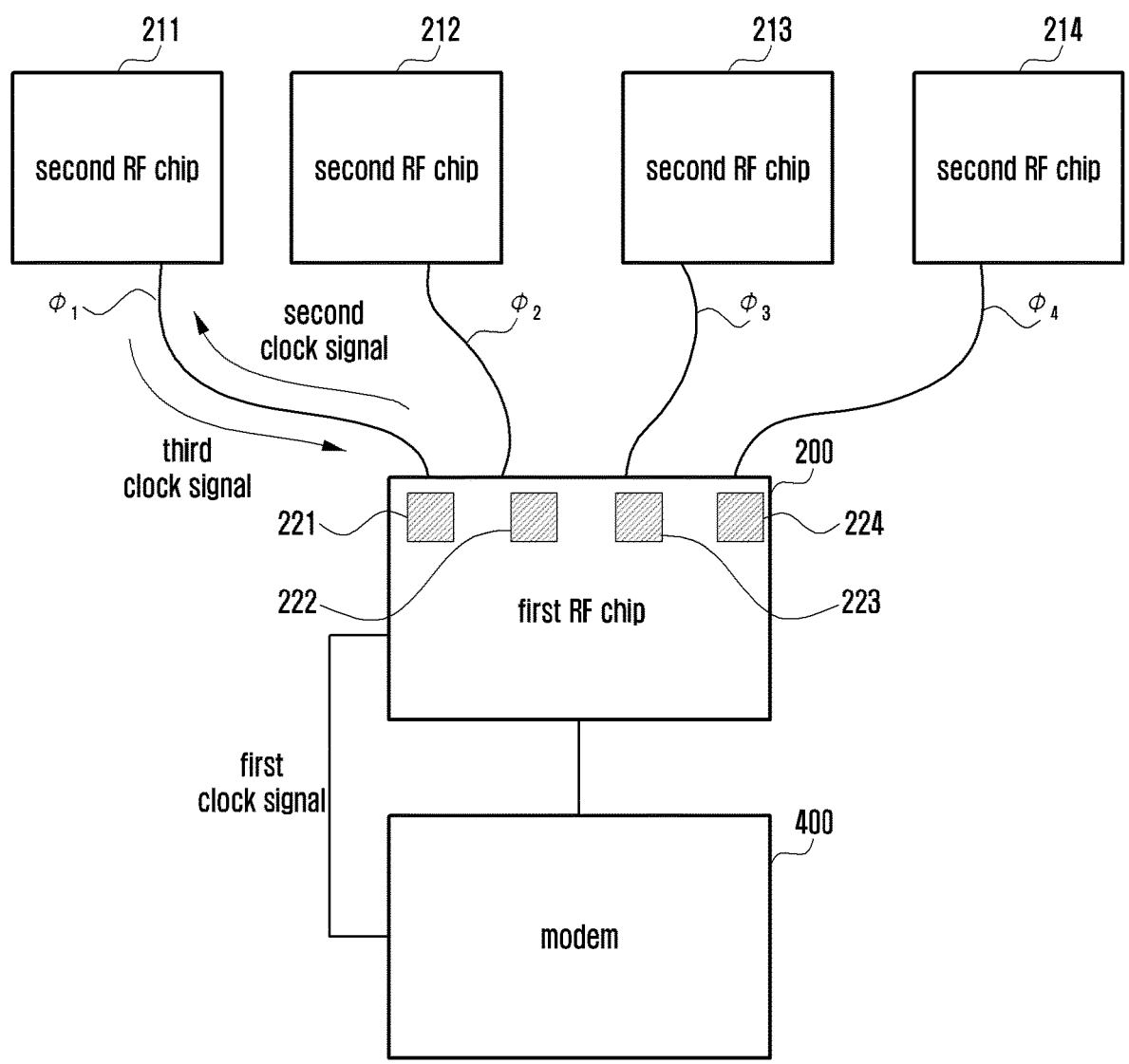
FIG. 5 is a diagram of a structure of an electronic device having a plurality of RF chips, according to an embodiment.

FIG. 5 is a diagram of a structure of an electronic device having a plurality of RF chips, according to an embodiment.

Referring to FIG. 5, one first RF chip 200 may be connected to four second RF chips 211, 212, 213, and 214, and may be connected to a modem 400. The modem 400 may be a digital modem, and may modulate and demodulate signals transmitted and received through the first RF chip 200 and the second RF chip 211.

Phase measurement circuits 221, 222, 223, and 224 measuring the phase of the transmission line may be deployed on the first RF chip 200.

The first RF chip 200 may transmit the second clock signal to the respective second RF chips 211, 212, 213, and 214, and the respective second RF chips 211, 212, 213, and 214 may transmit a third clock signal obtained by converting the frequency of the second clock signal to the first RF chip 200.

Respective phase measurement circuits 221, 222, 223, and 224 may measure phases $\emptyset_1$, $\emptyset_2$, $\emptyset_3$, and $\emptyset_4$ of the transmission lines connecting between the first RF chip 200 and the respective second RF chips 211, 212, 213, and 214 based on the third clock signal and the first clock signal received from the modem 400.

The operations of the first RF chip 200 and the second RF chips 211, 212, 213, and 214 will be described in more detail with reference to FIG. 6. Although FIG. 5 illustrates a case where one first RF chip 200 and four second RF chips 211, 212, 213, and 214 are deployed inside the electronic device, the scope of the disclosure should not be limited to the number of RF chips as described above.

Figure 6:
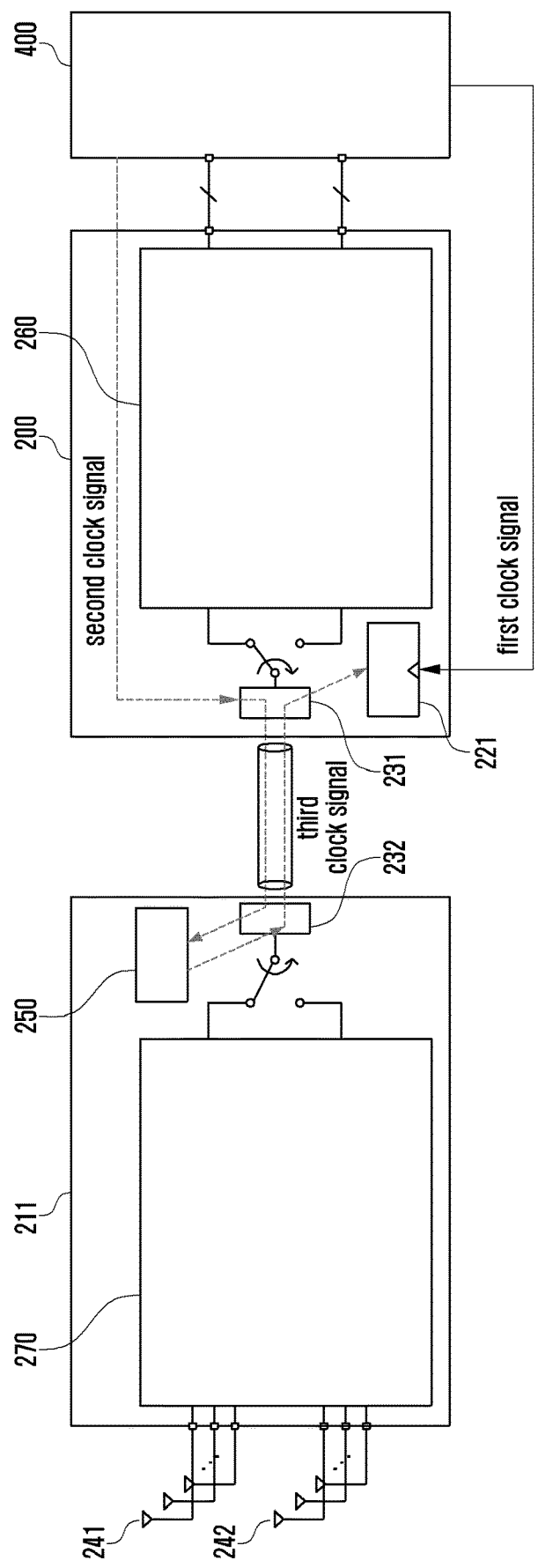
FIG. 6 is a diagram of an internal structure of an RF chip, according to an embodiment.

FIG. 6 is a diagram of an internal structure of an RF chip, according to an embodiment.

Referring to FIG. 6, the phase measurement circuit 221 for measuring the phase of the transmission line connecting between the first RF chip 200 and the second RF chip 211 are deployed within the first RF chip 200.

The first RF chip 200 having received the second clock signal from the modem 400 to measure the phase of the transmission line transmits this to the second RF chip 211, and the second RF chip 211 converts the second clock signal into the third clock signal through a frequency converter 250.

The third clock signal converted through the frequency converter 250 is transferred to the phase measurement circuit 221 of the first RF chip 200, and the phase measurement circuit 221 may measure the phase of the transmission line based on the first clock signal and the third clock signal received from the modem 400.

The clock signal reciprocates between the first RF chip 200 and the second RF chip 211 through the transmission line. The respective RF chips include the frequency selectors 231 and 232, and the second clock signal and the third clock signal can be simultaneously transmitted and received through the transmission line.

Further, if the frequency selectors 231 and 232 are composed of triplexers capable of simultaneously transmitting and receiving three or more frequency band signals, not only the signal for the beam radiation but also the second clock signal and the third clock signal for the transmission line measurement can be simultaneously transmitted and received through the transmission line as described above, and thus it becomes possible to perform real-time phase measurement of the transmission line.

The frequency converter 250 of the second RF chip 211 may generate the third clock signal through conversion of the frequency of the second clock signal into another frequency. The frequency converter 250 may convert the frequency of the second clock signal into the frequency of the third clock signal so that the frequency of the third clock signal becomes lower than the frequency of the second clock signal. Accordingly, it is possible to simultaneously send and receive a plurality of signals in a frequency division method through one transmission line.

If the frequency of the second clock signal is 2 GHz, and the frequency converter 250 reduces the frequency of the second clock signal to $\frac{1}{10}$, the frequency of the third clock signal may be 200 MHz, and the phase measurement circuit 221 may measure the phase of the transmission line connecting between the first RF chip and the second RF chip based on the frequency of the third clock signal and the frequency $f_1$ of the first clock signal having 200.1 MHz.

Figure 7A:
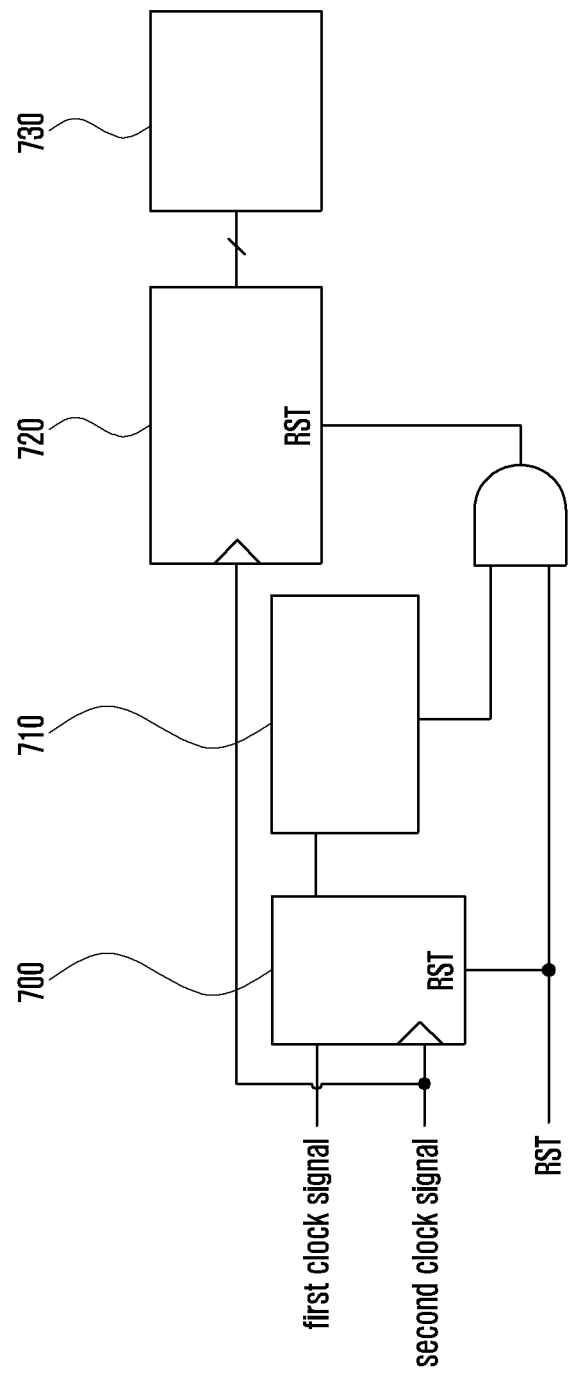
FIGS. 7A and 7B are diagrams of a configuration of a phase measurement circuit, according to an embodiment.
Figure 7B:
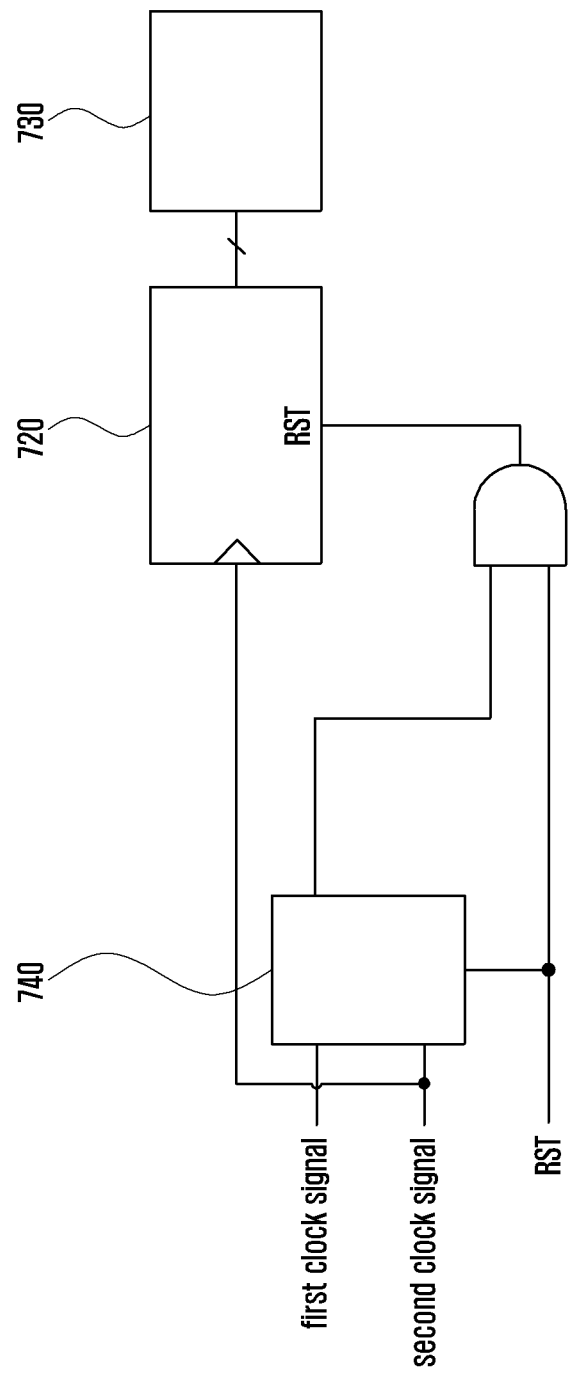

FIGS. 7A and 7B are diagrams of a configuration of a phase measurement circuit, according to an embodiment.

Since a phase measurement circuit illustrated in FIGS. 7A and 7B is a phase measurement circuit operating based on the first clock signal and the second clock signal, it may correspond a phase measurement circuit in the electronic device structure as illustrated in FIGS. 3 and 4A.

Referring to FIG. 7A, the phase measurement circuit may include a flip-flop 700 receiving an input of the first clock signal and the second clock signal. The flip-flop is a circuit that is called a trigger circuit, and can preserve either of two stable states. If an initial state is "1", the flip-flop continuously maintains the state of "1" so far as there is no input of an opposite state, whereas it is changed to a state of "0" if there is an input of an opposite signal. Various types of flip-flops, such as R—S flip-flop, J-K flip-flop, D flip-flop, and T flip-flop, may be configured.

In FIG. 7A, a reset trigger (RST) flip-flop is illustrated as a flip-flop. The RST flip-flop is a kind of RS flip-flop in which an input terminal that is in synchronization with a clock pulse is deployed, and its output may be changed based on a predetermined truth table.

The phase measurement circuit may further include a negative edge detector 710, a counter 720, and a memory 730, in addition to the flip-flop. The phase measurement circuit may record in the memory 730 a time in which the phase difference between the first clock signal and the second clock signal becomes a half period through the negative edge detector 710 and the counter 720. Through this, high-resolution time measurement may become possible.

If the frequency of the first clock signal is 153.5 MHz, and the frequency of the second clock signal is 153.6 MHz, the circuit may have resolution at a level of 2.12 ps (1/(2*153.5 MHz)−1/(2*156.6 MHz)=2.12 ps), and this is the resolution at a level that can be obtained through a high-band frequency (e.g., GHz-band frequency). Further, the resolution can be further improved through adjustment of the frequency of the first clock signal and the frequency of the second clock signal. More specifically, as the difference between the frequency of the first clock signal and the frequency of the second clock signal is reduced, the resolution of the phase measurement can be further improved.

The phase measurement circuit illustrated in FIG. 7A is a circuit for converting the phase difference of the transmission line into a digital value with the resolution as much as the period difference between the first clock signal and the second clock signal, and a method for measuring the phase of the transmission line through the circuit will be described with reference to FIG. 8.

Referring to FIG. 7B, FIG. 7B is a diagram of a phase measurement circuit including a phase detector receiving an input of the first clock signal and the second clock signal. The phase detector may measure the phase difference between two input frequencies through comparison, and may output a clock signal corresponding to the difference.

Figure 8:
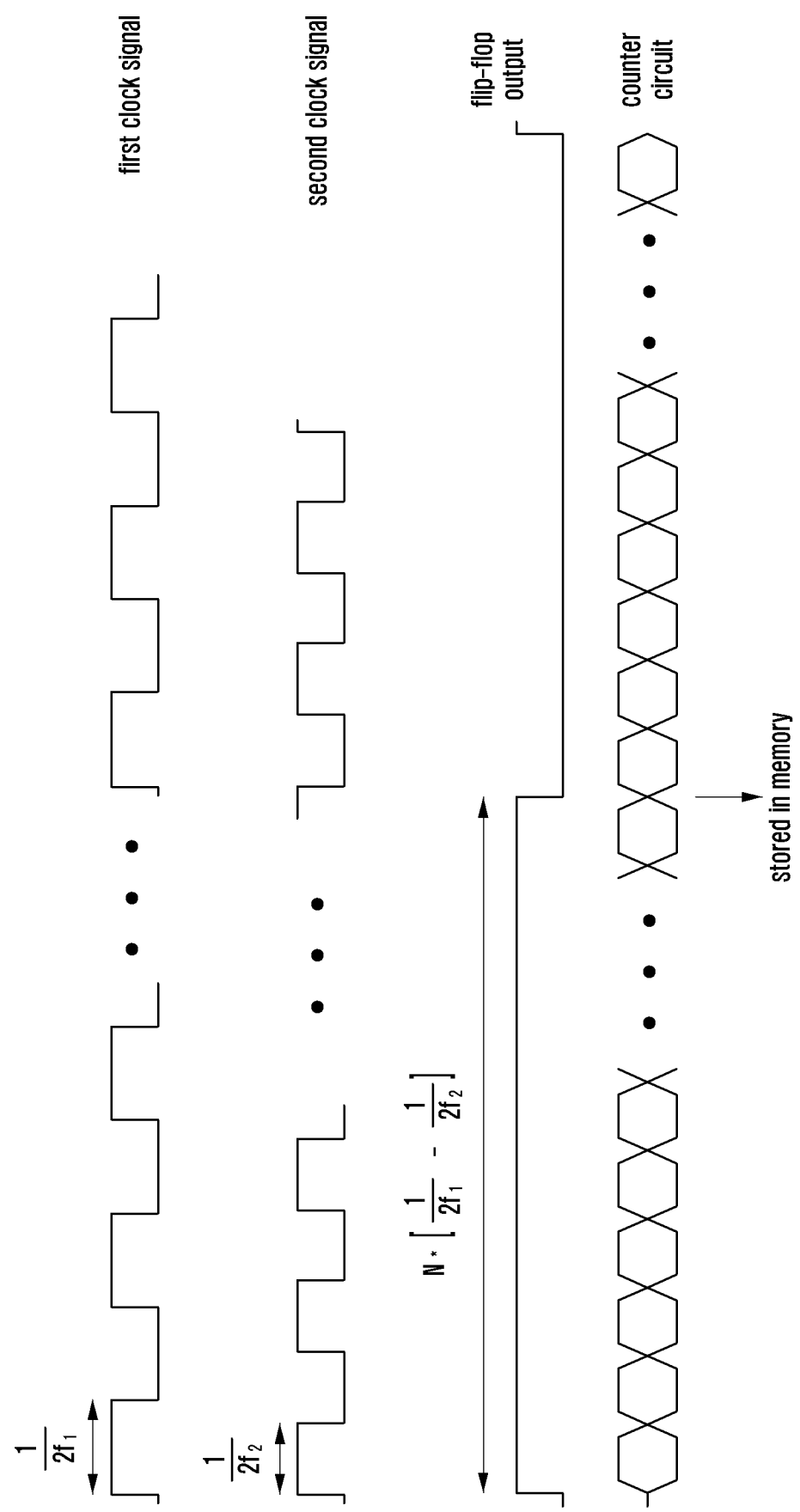
FIG. 8 is a diagram of measuring a phase of a transmission line through a phase measurement circuit, according to an embodiment.

Accordingly, the operation of the phase measurement circuit of FIG. 7B is similar to the operation of the phase measurement circuit of FIG. 7A, and thus the detailed explanation of the phase measurement circuit illustrated in FIG. 7B is replaced by the explanation with reference to FIGS. 7A and 8.

In order to improve the resolution of the phase measurement circuit illustrated in FIGS. 7A and 7B, a third clock signal and a fourth clock signal may be additionally considered. The first to fourth clock signals should have different frequencies from each other, and the phase measurement circuit may measure the phase of the transmission line based on the third clock signal and the fourth clock signal.

The number of times of phase measurement of the transmission line becomes greater than that when using the two clock signals, and thus the resolution of the phase measurement of the transmission line may be improved. However, since time and a load may become greater in measuring the phase of the transmission line, it is required to design the phase measurement circuit in consideration of the two merits and demerits as described above.

Accordingly, since the phase measurement circuit as illustrated in FIGS. 7A and 7B can be implemented using other logic circuits capable of performing the same operation, the scope of the present disclosure should not be limited to only the circuit structure illustrated in FIGS. 7A and 7B.

FIG. 8 is a diagram of measuring a phase of a transmission line through a phase measurement circuit, according to an embodiment.

Referring to FIG. 8, as described above, the first clock signal input through the flip-flop may have the frequency $f_1$, and the second clock signal may have the frequency $f_2$. In FIG. 8, a half period of the first clock signal may be $1/(2f_1)$, and a half period of the second clock signal may be $1/(2f_2)$.

Since the first clock signal and the second clock signal have different frequencies from each other, the second clock signal may maintain the original state in a moment that the first clock signal is changed from "1" to "0", and in this instance, the output of the flip-flop may continuously maintain the value of "1".

Thereafter, at a time when the first clock signal and the second clock signal are changed from "1" to "0", or from "0" to "1" in the same manner, the output of the flip-flop may be changed from "1" to "0". The counter circuit may perform counting for measuring the phase of the transmission line with the resolution as much as the period difference between the first clock signal and the second clock signal, and at a time when the output of the flip-flop is changed from "1" to "0", the counter circuit may store the counted value in the memory, and measure the phase of the transmission line using the counted value.

More specifically, if the frequency of the first clock signal is 153.5 MHz, and the frequency of the second clock signal is 153.6 MHz as described above, the period difference between the first clock signal and the second clock signal becomes 2.12 ps. Further, if the counter circuit counts the time when the output of the flip-flop is changed from "1" to "0" 10 times, the phase of the transmission line may be determined based on the value of 21.2 ps (=2.12 ps*10).

Thereafter, in order to measure the phase of the transmission line again, the phase measurement circuit should be reset, and thereafter, in the same manner as described above, the phase of the transmission line may be measured based on the value counted by the counter circuit at a time when the output of the flip-flop is changed from "1" to "0".

The minimum unit in which the phase of the transmission line is measured may be determined by the half-period difference between the first clock signal and the second clock signal, and high-resolution phase measurement may become possible even if the first clock signal and the second clock signal having low frequencies are used.

Figure 9:
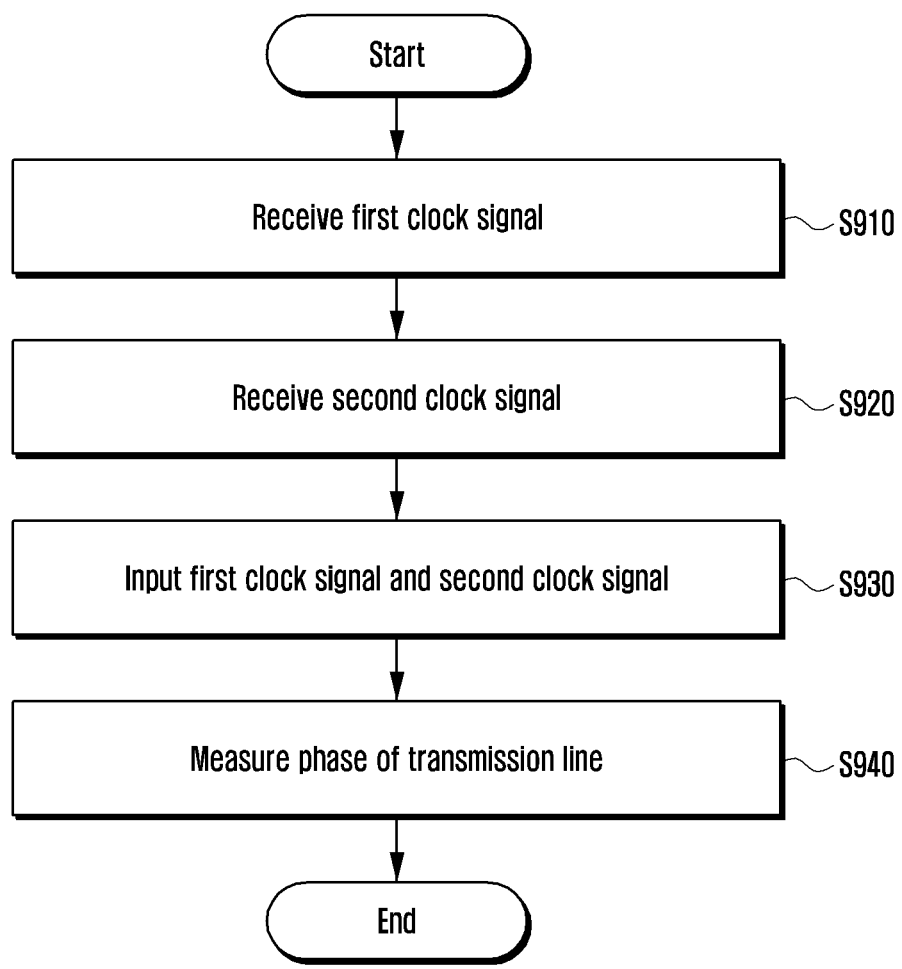
FIG. 9 is a diagram of measuring a phase of a transmission line connecting between a first RF chip and a second RF chip, according to an embodiment.

FIG. 9 is a diagram of measuring a phase of a transmission line connecting between a first RF chip and a second RF chip, according to an embodiment.

Referring to FIG. 9, at step S910, the second RF chip may receive the first clock signal from the modem. Further, at step S920, the second RF chip may receive the second clock signal transmitted from the modem through the first RF chip, and, at step S930, the second RF chip may input the first clock signal and the second clock signal to the phase detector.

It will be apparent to those of ordinary skill in the art that the phase detector may be changed to another type of circuit (flip-flop circuit).

At step S940, the phase of the transmission line may be measured based on the output value of the phase detector and the frequency difference between the first clock signal and the second clock signal. The method for measuring the phase of the transmission line through step S940 is described with reference to FIG. 8.

Figure 10A:
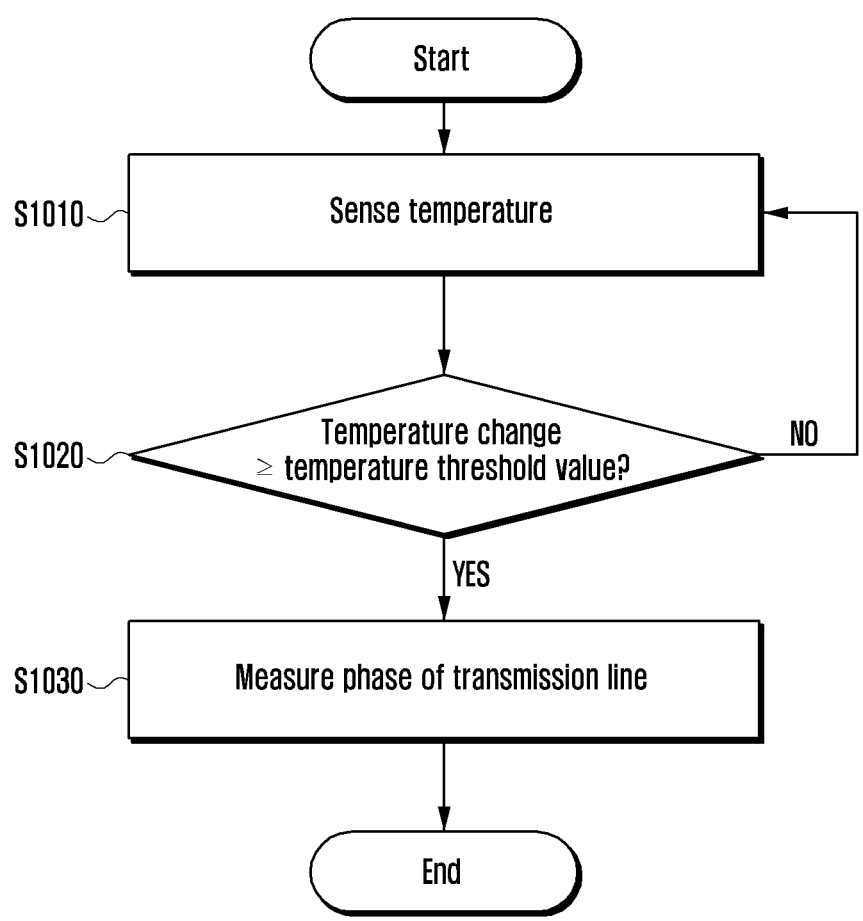
FIGS. 10A and 10B are diagrams of measuring a phase, according to an embodiment.
Figure 10B:
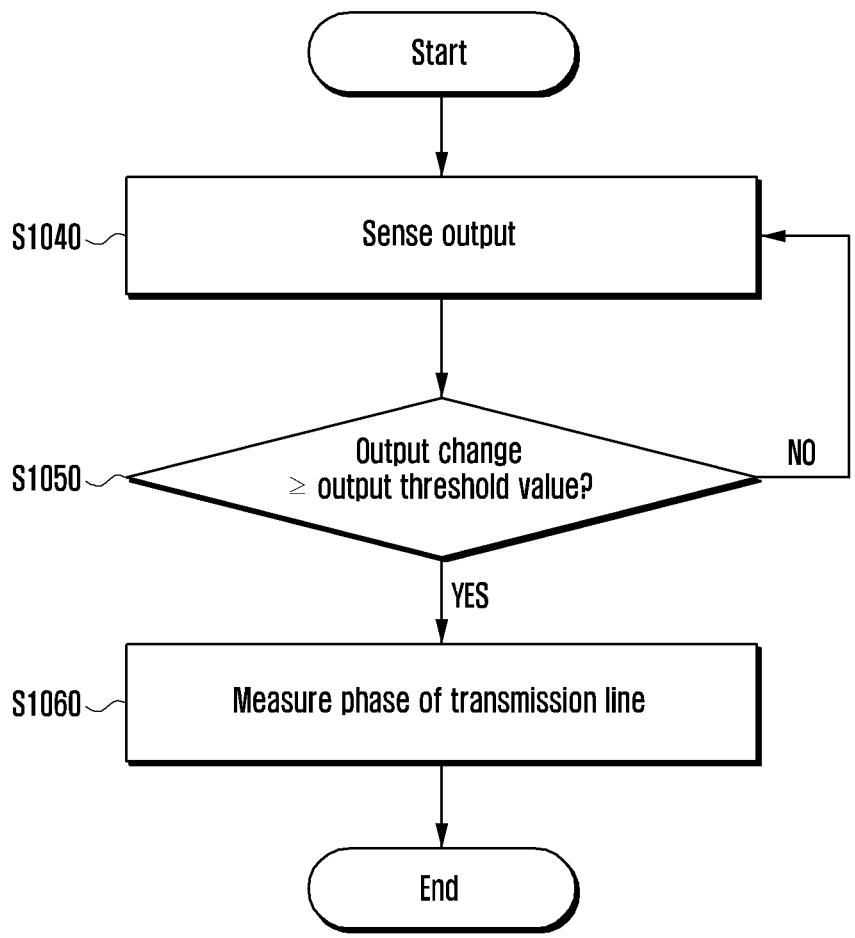

FIGS. 10A and 10B are diagrams of measuring a phase, according to an embodiment.

It is possible to measure the phase of the transmission line in real time while the signal for transmitting the beams is transmitted and received using the RF chips.

However, in order to measure the phase of the transmission line as described above, it is required for the signals, such as the first clock signal and the second clock signal, to be transmitted and received between the RF chips. Accordingly, such signal transmission and reception may act as a load on the RF chips, and through this, the efficiency of the RF chips may be deteriorated.

Accordingly, in order to efficiently measure the phase of the transmission line, it is necessary to heighten the number of times of phase measurement of the transmission line in an environment having high possibility that the phase of the transmission line is to be changed, and to lower the number of times of phase measurement of the transmission line in an environment having low possibility that the phase of the transmission line is to be changed.

Referring to FIGS. 10A and 10B, FIG. 10A illustrates a method for measuring the phase of the transmission line based on the temperature change of the RF chips, and FIG. 10B illustrates a method for measuring the phase of the transmission line based on the output change of the RF chips.

Referring to FIG. 10A, at step S1010, the temperature change of the second RF chip may be sensed. More specifically, as described above, the second RF chip itself may include a temperature change sensing sensor, and using the sensor, the temperature change can be sensed.

At step S1020, the second RF chip may determine whether the sensed temperature change is greater than or equal to the temperature threshold value. More specifically, if the sensed temperature change is 30° C., and the temperature threshold value is 20° C., it may be determined that the sensed temperature change through step S1020 is greater than or equal to the temperature threshold value.

If the temperature change is less than the temperature threshold value at step S1020, there is a low possibility that there is a big difference between the current phase of the transmission line and the previously measured phase of the transmission line, and the second RF chip does not measure the phase of the transmission line.

In contrast, if the temperature change is greater than or equal to the temperature threshold value, there is a high possibility that there is a difference between the current phase of the transmission line and the previously measured phase of the transmission line, and the second RF chip may measure the phase of the transmission line at step S1030.

Referring to FIG. 10B, at step S1040, the output change of the second RF chip may be sensed. More specifically, as described above, the second RF chip itself may include an output change sensing sensor, and using the sensor, the output change can be sensed.

At step S1050, the second RF chip may determine whether the sensed output change is greater than or equal to the output threshold value, and if the output change is less than the output threshold value at step S1050, there is a low possibility that there is a big difference between the current phase of the transmission line and the previously measured phase of the transmission line, and the second RF chip does not measure the phase of the transmission line.

In contrast, if the output change is greater than or equal to the output threshold value, there is a high possibility that there is a difference between the current phase of the transmission line and the previously measured phase of the transmission line, and the phase of the transmission line may be measured at step S1060.

Although FIGS. 10A and 10B illustrate only the method for measuring the phase of the transmission line based on the temperature change and the output change of the second RF chip, it is also possible to determine whether to measure the phase of the transmission line based on the temperature change and the output change of the first RF chip in case where the phase measurement circuit is included in the first RF chip. Accordingly, the scope of the present disclosure should not be limited to only the technical feature illustrated in FIGS. 10A and 10B.

The present disclosure provides a method capable of accurately measuring the phase of beams created through a plurality of RF chips in a system structure using the respective RF chips. More specifically, the present disclosure provides a method capable of accurately measuring the phase of a transmission line connecting between a first RF chip and a second RF chip in case where a wireless communication system is composed of the first and second RF chips.

According to the aspects of the present disclosure, the number of times of phase measurement of the transmission line connecting a plurality of RF chips at low power can be improved, and through this, the phase of the transmission line can be accurately measured.

In addition, according to the aspects of the present disclosure, accuracy of the phase measurement can be improved through performing of the phase measurement with two or more frequencies.

Further, according to a transmission-line phase measurement algorithm in the present disclosure, since the phase of the transmission line can be accurately measured through minimization of an area and power increase, phase compensation of the transmission line based on this becomes possible, and thus real-time transmission-line phase measurement and the phase compensation based on this become possible even while beams are radiated to the outside of an electronic device through the RF chips.

Various embodiments of the present disclosure may be implemented by software including an instruction stored in a machine-readable storage media readable by a machine (e.g., a computer). The machine may be a device that calls the instruction from the machine-readable storage media and operates depending on the called instruction and may include the electronic device. When the instruction is executed by the processor, the processor may perform a function corresponding to the instruction directly or using other components under the control of the processor. The instruction may include a code generated or executed by a compiler or an interpreter. The machine-readable storage media may be provided in the form of non-transitory storage media. Here, the term "non-transitory", as used herein, is a limitation of the medium itself (i.e., tangible, not a signal) as opposed to a limitation on data storage persistency.

According to an embodiment, the method according to various embodiments disclosed in the present disclosure may be provided as a part of a computer program product. The computer program product may be traded between a seller and a buyer as a product. The computer program product may be distributed in the form of machine-readable storage medium (e.g., a compact disc read only memory (CD-ROM)) or may be distributed only through an application store (e.g., a Play Store™). In the case of online distribution, at least a portion of the computer program product may be temporarily stored or generated in a storage medium such as a memory of a manufacturer's server, an application store's server, or a relay server.

Each component (e.g., the module or the program) according to various embodiments may include at least one of the above components, and a portion of the above sub-components may be omitted, or additional other sub-components may be further included. Alternatively or additionally, some components may be integrated in one component and may perform the same or similar functions performed by each corresponding components prior to the integration. Operations performed by a module, a programming, or other components according to various embodiments of the present disclosure may be executed sequentially, in parallel, repeatedly, or in a heuristic method. Also, at least some operations may be executed in different sequences, omitted, or other operations may be added.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof.

What is claimed is:

1. An electronic device including a first radio frequency (RF) chip and a second RF chip, comprising:
   a modem configured to transmit a first clock signal to the second RF chip;
   the first RF chip connected to the modem and configured to receive a second clock signal from the modem; and
   the second RF chip electrically connected to the first RF chip through a transmission line and configured to receive the second clock signal from the first RF chip and to measure a phase of the transmission line based on the first clock signal and the second clock signal,
   wherein the first clock signal and the second clock signal have different frequencies,
   wherein the second RF chip comprises a phase detector configured to receive an input of the first clock signal and the second clock signal, and
   wherein the second RF chip measures the phase of the transmission line based on an output change of the phase detector.

2. The electronic device of claim 1, wherein the second RF chip comprises a flip-flop configured to receive an input of the first clock signal and the second clock signal, and
   wherein the second RF chip measures the phase of the transmission line based on an output change of the flip-flop.

3. The electronic device of claim 2, wherein the second RF chip further comprises a counter configured to receive the input of the first clock signal and the second clock signal, and
   wherein the second RF chip measures the phase of the transmission line based on an output value of the counter and a frequency difference between the first clock signal and the second clock signal if an output value of the flip-flop is changed.

4. The electronic device of claim 1, wherein the first RF chip and the second RF chip comprise a frequency selector configured to enable a plurality of frequency band signals to be transmitted and received through the transmission line.

5. The electronic device of claim 1, wherein the modem transmits a third clock signal to the second RF chip,
   the first RF chip receives a fourth clock signal from the modem,
   the second RF chip receives the fourth clock signal from the first RF chip and measures the phase of the transmission line based on the third clock signal and the fourth clock signal, and
   the first to fourth clock signals have different frequencies from one another.

6. The electronic device of claim 1, wherein the second RF chip comprises a temperature sensor configured to sense a temperature of the second RF chip, and
   wherein the second RF chip measures the phase of the transmission line based on the first clock signal and the second clock signal if a temperature change of the second RF chip sensed through the temperature sensor is greater than or equal to a predetermined temperature threshold value.

7. The electronic device of claim 1, wherein the second RF chip comprises an output sensor configured to sense an output of the second RF chip, and
   wherein the second RF chip measures the phase of the transmission line based on the first clock signal and the second clock signal if an output change of the second RF chip sensed through the output sensor is greater than or equal to a predetermined output threshold value.

8. An electronic device including a first radio frequency (RF) chip and a second RF chip, comprising:
   a modem configured to transmit a first clock signal and a second clock signal to the first RF chip;
   the first RF chip electrically connected to the second RF chip through a transmission line and configured to transmit the second clock signal to the second RF chip, to receive from the second RF chip a third clock signal fed back corresponding to the second clock signal, and to measure a phase of the transmission line based on the first clock signal and the third clock signal; and
   the second RF chip formed to radiate beams to an outside of the electronic device,
   wherein the first clock signal and the second clock signal have different frequencies from each other.

9. The electronic device of claim 8, wherein the first RF chip comprises a phase detector configured to receive an input of the first clock signal and the third clock signal, and
   wherein the first RF chip measures the phase of the transmission line based on an output change of the phase detector.

10. The electronic device of claim 8, wherein the first RF chip comprises a flip-flop configured to receive an input of the first clock signal and the third clock signal, and
    wherein the first RF chip measures the phase of the transmission line based on an output change of the flip-flop.

11. The electronic device of claim 10, wherein the first RF chip further comprises a counter configured to receive the input of the first clock signal and the third clock signal, and
    wherein the first RF chip measures the phase of the transmission line based on an output value of the counter and a frequency difference between the first clock signal and the third clock signal if an output value of the flip-flop is changed.

12. The electronic device of claim 8, wherein the first RF chip and the second RF chip comprise a frequency selector configured to enable a plurality of frequency band signals to be transmitted and received through the transmission line.

13. The electronic device of claim 8, wherein the second RF chip comprises a frequency converter, and wherein the frequency of the first clock signal is converted into the frequency of the second clock signal through the frequency converter.

14. The electronic device of claim 13, wherein the frequency of the first clock signal is higher than the frequency of the second clock signal.

15. The electronic device of claim 8, wherein the first RF chip comprises a temperature sensor configured to sense a temperature of the first RF chip, and
wherein the first RF chip measures the phase of the transmission line based on the first clock signal and the third clock signal if a temperature change of the first RF chip sensed through the temperature sensor is greater than or equal to a predetermined temperature threshold value.

16. The electronic device of claim 8, wherein the first RF chip comprises an output sensor configured to sense an output of the first RF chip, and
wherein the first RF chip measures the phase of the transmission line based on the first clock signal and the third clock signal if an output change of the first RF chip sensed through the output sensor is greater than or equal to a predetermined output threshold value.

17. A method for measuring a phase of a transmission line connecting a first RF chip and a second RF chip to each other, comprising:
receiving, by the second RF chip, a first clock signal from a modem;
receiving, by the second RF chip, a second clock signal transmitted from the modem through the first RF chip;
inputting, by the second RF chip, the first clock signal and the second clock signal to a phase detector;
measuring, by the second RF chip, a phase of the transmission line based on an output value of the phase detector and a frequency difference between the first clock signal and the second clock signal;
sensing, by the second RF chip, a temperature of the second RF chip; and
measuring, by the second RF chip, the phase of the transmission line based on the output value of the phase detector and the frequency difference between the first clock signal and the second clock signal if a temperature change of the second RF chip is greater than or equal to a predetermined temperature threshold value.

18. The method of claim 17, further comprising:
sensing, by the second RF chip, an output of the second RF chip; and
measuring, by the second RF chip, the phase of the transmission line based on the output value of the phase detector and the frequency difference between the first clock signal and the second clock signal if an output change of the second RF chip is greater than or equal to a predetermined output threshold value.

* * * * *